United States Patent
Wang et al.

(10) Patent No.: US 7,239,555 B1
(45) Date of Patent: Jul. 3, 2007

(54) ERASING METHOD FOR NON-VOLATILE MEMORY

(75) Inventors: Kuo-Tung Wang, Hsinchu (TW); Yen-Lee Pan, Hsinchu (TW); Kuo-Hao Chu, Hsinchu County (TW); Cheng-Yuan Hsu, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/308,018

(22) Filed: Mar. 3, 2006

(30) Foreign Application Priority Data

Dec. 13, 2005  (TW) .............................. 94144007 A

(51) Int. Cl.
*G11C 16/04* (2006.01)

(52) U.S. Cl. .......................... 365/185.31; 365/185.14; 365/185.17; 365/185.29

(58) Field of Classification Search ............ 365/185.31
See application file for complete search history.

(56) References Cited

U.S. PATENT DOCUMENTS

| | | | |
|---|---|---|---|
| 5,579,259 A * | 11/1996 | Samachisa et al. .... | 365/185.14 |
| 6,876,031 B1 * | 4/2005 | Kao et al. .................. | 257/315 |
| 6,885,586 B2 * | 4/2005 | Chen et al. ............. | 365/185.17 |
| 2004/0232473 A1 * | 11/2004 | Hsu et al. .................... | 257/315 |
| 2005/0169035 A1 * | 8/2005 | Hsu et al. ................... | 365/120 |
| 2005/0207225 A1 * | 9/2005 | Chen et al. ............. | 365/185.17 |
| 2006/0024887 A1 * | 2/2006 | Wong et al. ................ | 438/257 |
| 2006/0098486 A1 * | 5/2006 | Hung et al. ............ | 365/185.17 |
| 2006/0114719 A1 * | 6/2006 | Lee ........................ | 365/185.17 |
| 2006/0120155 A1 * | 6/2006 | Sato et al. ............. | 365/185.17 |
| 2006/0273378 A1 * | 12/2006 | Gao et al. ................... | 257/326 |
| 2007/0045715 A1 * | 3/2007 | Sudo et al. ................. | 257/316 |

* cited by examiner

*Primary Examiner*—Son L. Mai
(74) *Attorney, Agent, or Firm*—Jiang Chyun IP Office

(57) ABSTRACT

An erasing method for a non-volatile memory is provided. The method includes the following two major steps. (a) A first voltage is applied to the odd-numbered select gates of each memory row and a second voltage is applied to the even-numbered select gates of each memory row such that the voltage difference between the first voltage and the second voltage is large enough for the electrons injected into the floating gate of the memory cells to be removed via the select gate. (b) A switchover operation is performed so that the first voltage is applied to the even-numbered select gates of each memory row and the second voltage is applied to the odd-numbered select gates of each memory row such that the electrons injected into the floating gates of the memory cells are pulled away via the select gates to turn the memory cells into an erased state.

17 Claims, 3 Drawing Sheets

ERASING METHOD FOR NON-VOLATILE MEMORY

CROSS-REFERENCE TO RELATED APPLICATION

This application claims the priority benefit of Taiwan application serial no. 94144007, filed on Dec. 13, 2005. All disclosure of the Taiwan application is incorporated herein by reference.

BACKGROUND OF THE INVENTION

1. Field of the Invention

The present invention relates to a non-volatile memory device. More particularly, the present invention relates to an erasing method for a non-volatile memory.

2. Description of the Related Art

Non-volatile memory is a type of data storage device capable of retaining data even after power to the device is removed. Therefore, this type of memory has become one of the indispensable components inside many electronic products for initiating a normal start-up operation. In particular, flash memory is a type of non-volatile memory that allows multiple data writing, reading and erasing operations. With these advantages, flash memory has become one of the most widely adopted non-volatile memories for personal computers and electronic equipments.

A typical flash memory has a floating gate and a control gate fabricated using doped polysilicon. Furthermore, the control gate is directly disposed above the floating gate. The floating gate and the control gate are separated from each other through a dielectric layer. The floating gate is also separated from the substrate through a tunneling oxide layer (in the so-called stacked gate flash memory).

At present, the frequently used flash memory array may have a NOR gate array structure or a NAND gate array structure. Because all the memory cells in a NAND gate array structure are serially connected together, it has a higher level of integration than the NOR gate array structure. In general, the erasing operation of the memory cell in a NAND gate array structure includes pulling electrons from the floating gate into the substrate via the tunneling oxide layer. Hence, the tunneling oxide layer can be damaged when operating at a high voltage, thus adversely affecting the reliability of the device.

On the other hand, to prevent data errors due to serious over-erasure of a typical flash memory, an additional select gate is often set up on the sidewalls of the control gate and the floating gate and above the upper surface of the substrate to form a split-gate structure.

To erase data from a NAND gate array structure having select gates, a 0 volt (V) is applied to the control gate and a positive biased voltage is applied to all the select gates. As a result, a large electric field is established between the floating gate and the select gate so that the electrons are pulled out from the floating gate into the select gate. However, the aforementioned erasing method will lower the electric field between the floating gate and the select gate due to a coupling effect between adjacent select gates, which lowers the erasing efficiency of the memory.

Another erasing method is proposed by applying a positive biased voltage to the odd-numbered select gates of the NAND gate array structure and applying a 0V to the even-numbered select gates. Alternatively, a 0V is applied to the odd-numbered select gates of the NAND gate array structure and a positive biased voltage is applied to the even-numbered select gates to complete the data erasing operation. In other words, the foregoing erasing method utilizes just one side of the NAND gate array structure to improve inefficient erasing of the data in the memory. However, this method also has a few problems. For example, erasing failure may appear on the same row of memory cells during the erasing operation, and the reliability and yield of the memory device will be significantly affected.

SUMMARY OF THE INVENTION

Accordingly, at least one objective of the present invention is to provide an erasing method for a non-volatile memory, which can increase the erasing efficiency of the memory as well as the reliability and yield of the memory device.

At least another objective of the present invention is to provide an alternative erasing method for a non-volatile memory, which can equally increase the erasing efficiency of the memory as well as the reliability and yield of the memory device.

To achieve these and other advantages and in accordance with the purpose of the invention, as embodied and broadly described herein, the invention provides an erasing method for a non-volatile memory. The method is suitable for a memory cell array with a plurality of memory cell rows. The memory cells in each memory cell row are serially connected with each other between a source and a drain. Furthermore, select gates are disposed between every two adjacent memory cells, between the memory cell closest to the source region and the source region and between the memory cell closest to the drain and the drain region. Each memory cell includes at least a tunneling dielectric layer, a floating gate and a control gate. The method includes: (a) applying a first voltage to the odd-numbered select gates of each memory row and applying a second voltage to the even-numbered select gates of each memory row such that the voltage difference between the first voltage and the second voltage is large enough for the electrons injected into the floating gate of the memory cells to be removed via the select gate; and, (b) performing a switchover operation so that the first voltage is applied to the even-numbered select gates of each memory row and the second voltage is applied to the odd-numbered select gates of each memory row, and that the electrons injected into the floating gates of the memory cells are pulled away via the select gates to turn the memory cells into an erased state.

According to one preferred embodiment of the present invention, after performing the foregoing step (a), the method further includes verifying if any of the memory cells in each memory cell row has erasing failure. If at least one of the memory cells in a memory cell row has erasing failure, the switchover operation in step (b) is performed. As a result, the electrons injected into the floating gate of the memory cells are pulled away via the select gates to turn the memory cells into an erased state.

According to one preferred embodiment of the present invention, the first voltage is between about 10V to 11V and the second voltage is 0V.

According to one preferred embodiment of the present invention, the first voltage is 0V and the second voltage is between about 10V to 11V.

The present invention also provides an alternative erasing method for a non-volatile memory. The method is suitable for a memory cell array with a plurality of memory cell rows. The memory cells in each memory cell row are serially connected with each other between a source and a drain.

Furthermore, select gates are disposed between every pair of adjacent memory cells, between the memory cell closest to the source region and the source region and between the memory cell closest to the drain and the drain region. Each memory cell includes at least a tunneling dielectric layer, a floating gate and a control gate. The method includes: (a) applying a first voltage to the odd-numbered select gates of each memory row and applying a second voltage to the even-numbered select gates of each memory row such that the voltage difference between the first voltage and the second voltage is large enough for the electrons injected into the floating gate of the memory cells to be removed via the select gate; and, (b) performing a switchover operation so that the a third voltage instead of the second voltage is now applied to the even-numbered select gates of each memory row, and that the electrons injected into the floating gates of the memory cells are pulled away via the select gates to turn the memory cells into an erased state.

According to one preferred embodiment of the present invention, after performing the foregoing step (a), the method further includes verifying if any of the memory cells in each memory cell row has erasing failure. If at least one of the memory cells in a memory cell row has erasing failure, the switchover operation in step (b) is performed. As a result, the electrons injected into the floating gate of the memory cells are pulled away via the select gates to turn the memory cells into an erased state.

According to one preferred embodiment of the present invention, the first voltage is between about 10V to 11V, the second voltage is 0V, and the third voltage is equal to the first voltage. In addition, the third voltage can be between about 10V to 11V.

According to one preferred embodiment of the present invention, after performing the foregoing step (a), the method further includes verifying if any of the memory cells in each memory cell row has erasing failure. If at least one of the memory cells in a memory cell row has erasing failure, the switchover operation in step (b) is performed such that a third voltage, instead of the first voltage, is applied to the odd-numbered select gates of each memory cell row. As a result, the electrons injected into the floating gate of the memory cells are pulled away via the select gates to turn the memory cells into an erased state. The first voltage is 0V, the second voltage is between about 10V to 11V, and the third voltage is equal to the second voltage. In addition, the third voltage can be between about 10V to 11V.

In the present invention, the voltage applied to the select gates is switched to perform a data erasing operation when any of the memory cells in the memory cell row has erasing failure. This prevents any problem associated with an erasing failure in the memory cell. In addition, the present invention also effectively increases the reliability and yield of the memory device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
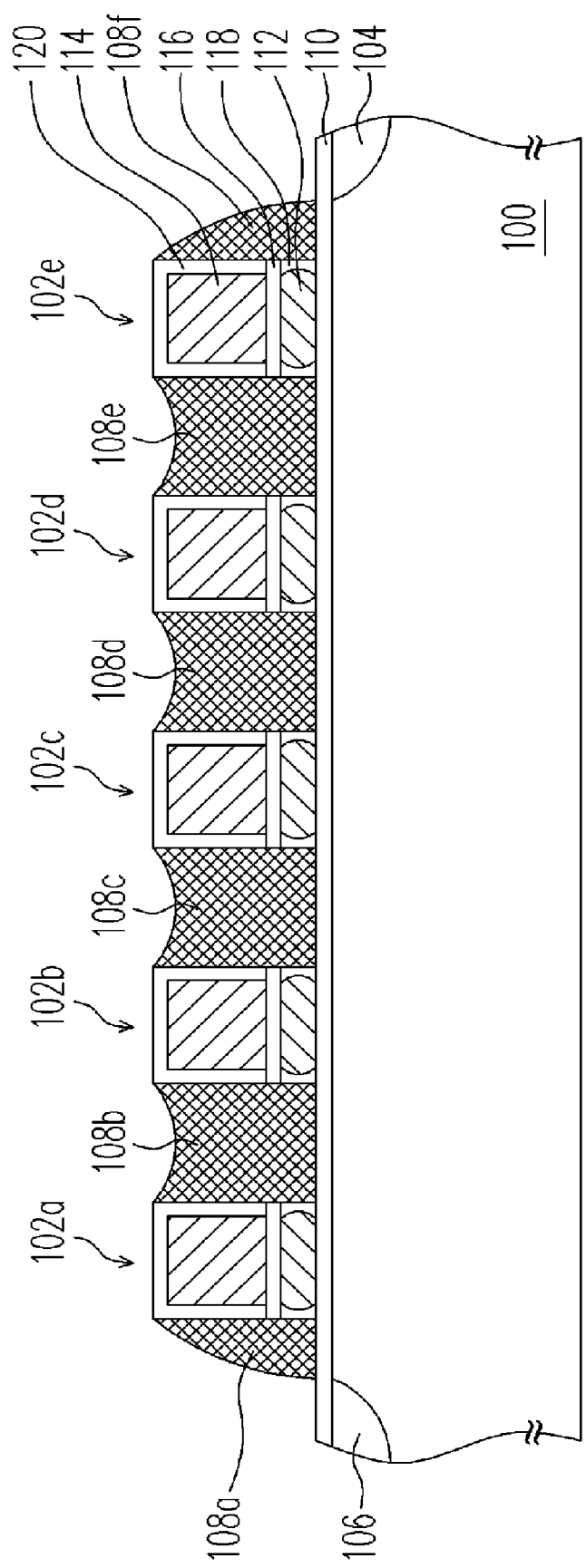
FIG. 1 is a schematic cross-sectional view showing a non-volatile memory structure according to the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view showing a non-volatile memory structure according to the present invention. In FIG. 1, only one memory cell row having 5 connected memory cells is shown. However, this should by no means limit the number of memory cells in a memory cell row. In the following, the non-volatile memory structure is explained using just a single memory cell row.

As shown in FIG. 1, the NAND gate flash memory array structure in the present invention includes a plurality of memory cell rows. The memory cell rows are disposed on a substrate 100. The memory cells 102a~102e of each memory cell row are serially connected together between a source region 104 and a drain region 106. Furthermore, select gates 108b~108e are disposed between every two adjacent memory cells 102a~102e. Similarly, a select gate 108f is disposed between the memory cell 102e closest to the source region 104 and the source region 104 and another select gate 108a is disposed between the memory cell 102a closest to the drain region 106 and the drain region 106.

Each of the foregoing memory cells 102a~102e includes at least a tunneling dielectric layer 110, a floating gate 112 and a control gate 114. Each of the memory cells 102a~102e has a structure comprising a tunneling dielectric layer 110, a floating gate 112 and a control gate 114 sequentially stacked over a substrate 100. The tunneling dielectric layer 110 is fabricated using silicon oxide, for example. The floating gate is fabricated using doped polysilicon, for example. Moreover, there is an inter-gate dielectric layer 116 between the floating gate 112 and the control gate 114. The inter-gate dielectric layer 116 is fabricated using silicon oxide, for example. In addition, spacers 118 are disposed between the floating gates 112 and the select gates 108a~108f and serve as an insulating layer between the floating gates 112 and the select gates 108a~108f. A spacer 120 is also disposed on the surface of the control gates 114 to serve as an insulating layer between the control gates 114 and the select gates 108a~108f.

In the foregoing embodiment, five memory cells are serially connected together to form a memory cell row. Obviously, the number of memory cells can be changed according to the actual need. For example, one memory cell row may include a total of 32 to 64 of serially connected memory cells.

FIGS. 2A through 2D are simplified circuit diagrams of a non-volatile memory that show various erasing modes of operations for the non-volatile memory according to the present invention. To simplify the explanations, the following description refers to a single memory cell row.

Figure 2B:
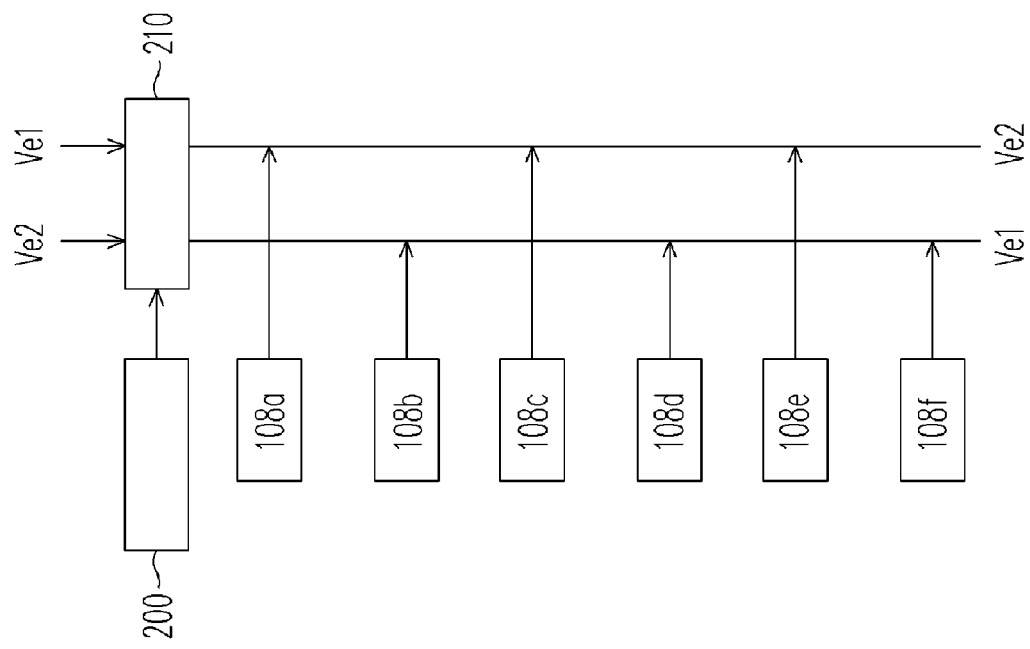
FIGS. 2A through 2D are simplified circuit diagrams of a non-volatile memory showing various erasing modes of operations for the non-volatile memory according to the present invention.
Figure 2A:
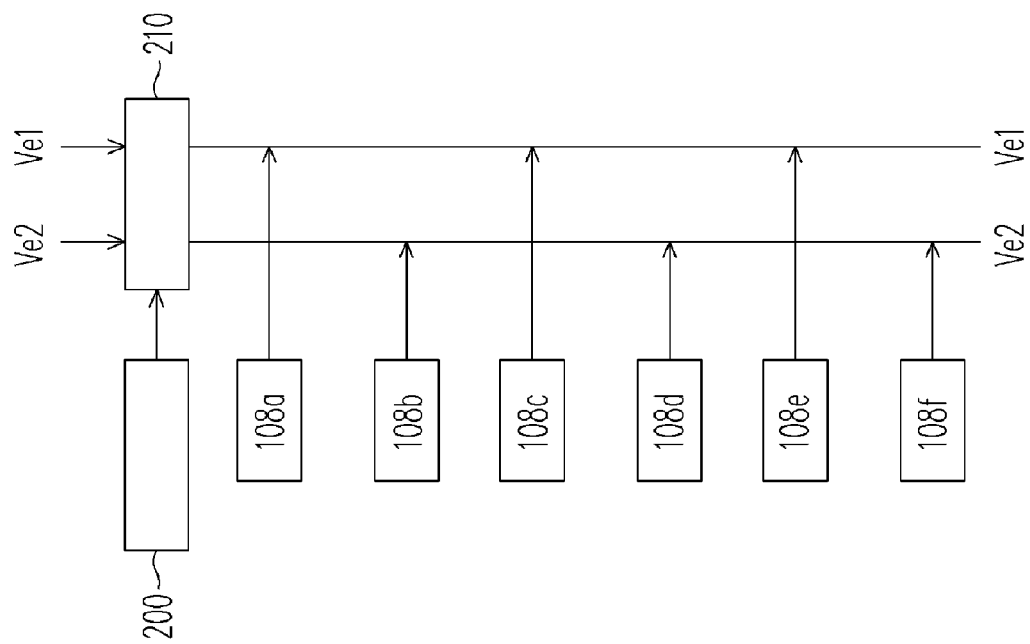

As shown in FIGS. 1 and 2A, a first voltage $V_{e1}$ is applied to all the odd-numbered select gates 108a, 108c, 108e of the memory cell row and a second voltage $V_{e2}$ is applied to all the even-numbered select gates 108b, 108d, 108f of the memory cell row. The aforementioned step of applying a first voltage $V_{e1}$ and a second voltage $V_{e2}$ can be executed, for example, through a controller 200 and a high voltage/ground (HV/GND) switch to distribute to the odd-numbered select gates 108a, 108c, 108e and the even-numbered select gates 108b, 108d, 108f. The first voltage $V_{e1}$ is between about 10V to 11V and the second voltage $V_{e2}$ is 0V. Furthermore, the voltage difference between the first voltage $V_{e1}$ and the second voltage $V_{e2}$ can produce a high electric field between the floating gates 112 and the select gates 108a, 108c and 108e. Hence, the electrons injected into the memory cells 102a~102e can be removed through the select gates 108a, 108c and 108e. In another embodiment, the voltage applied to the odd-numbered select gates 108a, 108c, 108e and the voltage applied to the even-numbered select gates 108b, 108d, 108f can be reversed. In other words, the first voltage $V_{e1}$ is 0V and the second voltage $V_{e2}$ can be between about 10V to 11V.

Thereafter, in the process of erasing the data in the memory cells, the memory cells 102a~102e of the memory cell row are checked to determine if any one of them has an erasing problem. If any of the memory cells 102a~102e of the memory cell row has abnormal erasing problem, then the erasing voltage can hardly be reduced any further. Therefore, the erasing efficiency of the memory cells will drop and the reliability of the memory device will be adversely affected.

Then, the foregoing processes of applying a voltage to the select gates 108a~108f and checking the memory cells 102a~102e for any abnormal erasing problem are repeated until the electrons injected into the floating gate 112 of the memory cells 102a~102e are pulled away via the select gates 108a, 108c and 108e so that the memory cells 102a~102e are turned into an erased state.

In the process of checking whether any one of the memory cells 102a~102e has an abnormal erasing problem, if at least one of the memory cells 102a~102e of the memory cell row is found to have an abnormal erasing problem, the application of the first voltage $V_{e1}$ and the second voltage $V_{e2}$ can be exchanged. In other words, the first voltage $V_{e1}$ is now applied to the even-numbered select gates 108b, 108d, 108f of the memory cell row while the second voltage $V_{e2}$ is applied to the odd-numbered select gates 108a, 108c, 108e of the memory cell row (as shown in FIG. 2B). The process of exchanging the applications of the first voltage $V_{e1}$ and the second voltage $V_{e2}$ can be carried out through a controller 200 that controls a high-voltage/ground switching device 210. This prevents the erasing problem in one of the memory cells from affecting the operating efficiency of the entire memory device. Thus, the reliability and yield of the non-volatile memory can be increased.

Obviously, the erasing method for the non-volatile memory in the present invention also permits a direct switching action between the first voltage and the second voltage, which achieves the erasing action of the memory cell with improved reliability of the memory.

Furthermore, as shown in FIGS. 1 and 2A, another erasing method for the non-volatile memory in the present invention includes using the controller 200 to control the high-voltage/ground switching device 210. Consequently, a first voltage $V_{e1}$ is applied to the odd-numbered select gates 108a, 108c, 108e of the memory cell row and a second voltage $V_{e2}$ is applied to the even-numbered select gates 108b, 108d, 108f of the memory cell row. Moreover, the voltage difference between the first voltage $V_{e1}$ and the second voltage $V_{e2}$ is large enough to remove the electrons injected into the floating gate 112 of the memory cells 102a~102e through the select gates 108a, 108c and 108e.

Then, the memory cells 102a~102e of the memory cell row is checked to determine if there is any abnormal erasing problem in the foregoing data erasing operation of the memory cells.

After that, the steps of applying a voltage to the select gates 108a~108f and checking for any abnormal erasing problem in the memory cells 102a~102e are performed until the electrons injected into the floating gates 112 of the memory cells 102a~102e are pulled away via the select gates 108a, 108c and 108e to turn the memory cells 102a~102e into an erased state.

In the process of determining whether any one of the memory cells 102a~102e has an abnormal erasing problem, if at least one of the memory cells 102a~102e of the memory cell row is found to have an abnormal erasing problem, the controller 200 can control the high-voltage/ground switching device 210 so that a third voltage $V_{e3}$ (shown in FIG. 2C) instead of the second voltage $V_{e2}$ is applied to the even-numbered select gates 108b, 108d and 108f. This prevents the abnormal erasing problem in one of the memory cells from affecting the operating efficiency of the entire memory. The first voltage $V_{e1}$ is between about 10V to 11V, the second voltage $V_{e2}$ is 0V, and the third voltage $V_{e3}$ is equal to the first voltage $V_{e1}$. However, the third voltage $V_{e3}$ can also be between 10V to 11V.

Figure 2D:
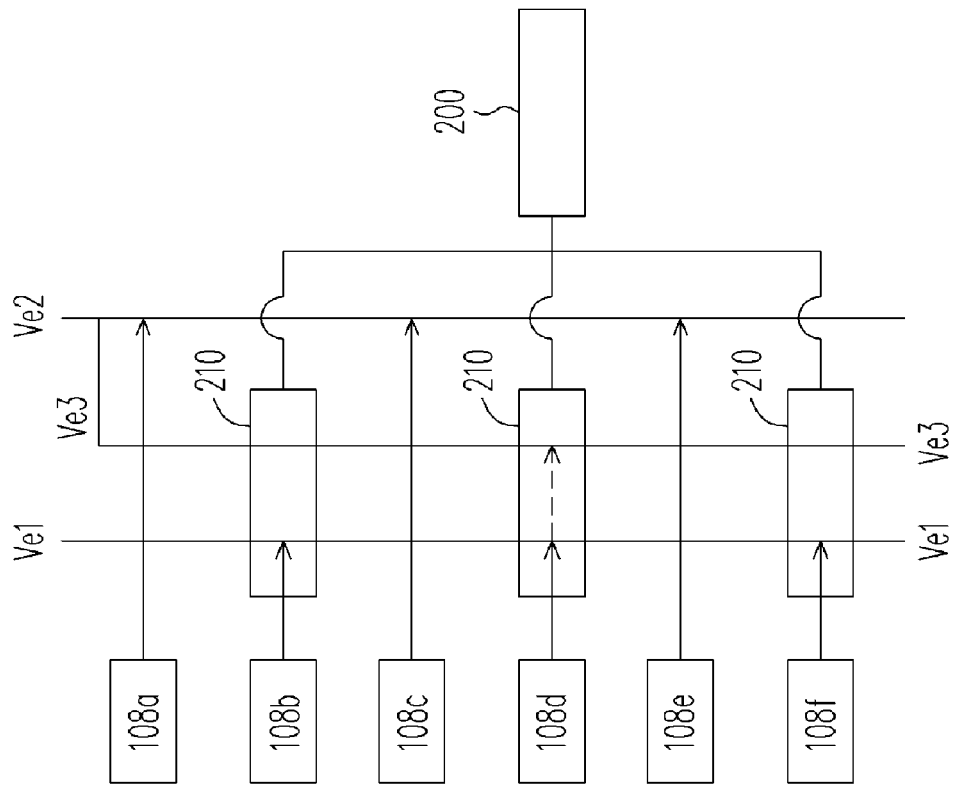
Figure 2C:
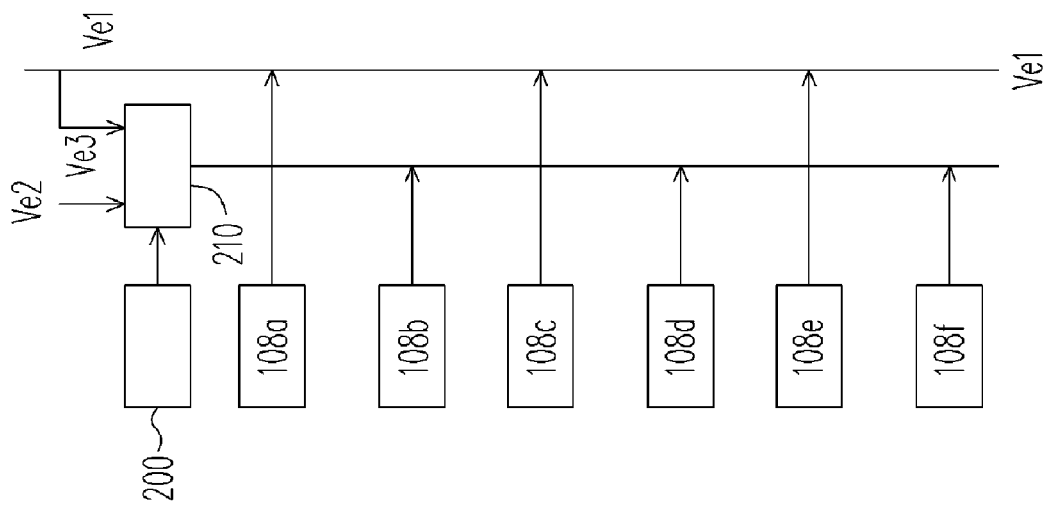

In another embodiment, in the process of checking whether the memory cells 102a~102e has an abnormal erasing problem, if at least one of the memory cells 102a~102e in the memory cell row is found to have an abnormal erasing problem, for example, the memory cell 102c, then the controller 200 can control the high-voltage/ground switching device 210 to exchange the first voltage $V_{e1}$ and apply a third voltage $V_{e3}$ (as shown in FIG. 2D) to the even-numbered select gate 108d. This prevents the abnormal erasing problem in the memory cell from affecting the operating efficiency of the entire memory. Here, the first voltage $V_{e1}$ is 0V, the second voltage $V_{e2}$ is between about 10V to 11V, and the third voltage $V_{e3}$ is equal to the second voltage $V_{e2}$. However, the third voltage $V_{e3}$ can be between 10V to 11V.

Obviously, the erasing method for the non-volatile memory in the present invention also permits a direct switching action for the first voltage or the second voltage. Similarly, the erasing action of the memory cell can be achieved with improved reliability of the memory.

In summary, the advantages of the present invention at least includes:

1. The present invention can prevent deterioration of the erasing efficiency for the entire memory due to any abnormal erasing problem in the memory cells. Hence, the overall erasing performance of the memory is improved.

2. Aside from preventing the problems resulting from an erasing failure, the present invention also increases the reliability and yield of the memory device.

3. The erasing method in the present invention includes removing the electrons in the floating gates by channeling them through the respective select gates. Thus, unlike the convention method with the damaging effect of electrons passing through the tunneling dielectric layer multiple times at a high operating voltage, the reliability of the memory device in the present invention is not compromised.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An erasing method for a non-volatile memory, suitable for a memory cell array having a plurality of memory cell rows, wherein memory cells in each memory cell row are serially connected together between a source region, and a select gate is disposed between every two adjacent memory cells, between the memory cell closest to the source region and the source region, and between the memory cell closest to the drain region and the drain region respectively, wherein each memory cell includes at least a tunneling dielectric layer, a floating gate and a control gate, the method comprising:

(a) applying a first voltage to odd-numbered select gates of the memory cell row and applying a second voltage to even-numbered select gates of the memory cell row, wherein a voltage difference between the first voltage and the second voltage is large enough for electrons injected into the floating gate of the memory cells to be removed via the select gates; and (b) performing a switchover action such that the first voltage and the second voltage are respectively applied to the even-numbered select gates and the odd-numbered select gates, and that the electrons injected into the floating gate of the memory cell are pulled away via the select gates to turn the memory cells in an erased state.

2. The erasing method of claim 1, wherein after performing the step (a), the method further comprises checking whether the memory cells of each memory cell row has any erasing failure, and if at least one of the memory cells in the memory cell row has an erasing failure, the switchover action in step (b) is performed so that the electrons injected into the floating gate of the memory cells are be pulled away via the select gates to turn the memory cells into an erased state.

3. The erasing method of claim 1, wherein the first voltage is between about 10V to 11V.

4. The erasing method of claim 3, wherein the second voltage is 0V.

5. The erasing method of claim 1, wherein the first voltage is 0V.

6. The erasing method of claim 5, wherein the second voltage is between about 10V to 11V.

7. An erasing method for a non-volatile memory, suitable for a memory cell array having a plurality of memory cell rows, wherein memory cells in each memory cell row are serially connected together between a source region, and a select gate is disposed between every two adjacent memory cells, between the memory cell closest to the source region and the source region, and between the memory cell closest to the drain region and the drain region respectively, wherein each memory cell includes at least a tunneling dielectric layer, a floating gate and a control gate, the method comprising:

(a) applying a first voltage to odd-numbered select gates of the memory cell row and applying a second voltage to even-numbered select gates of the memory cell row, wherein a voltage difference between the first voltage and the second voltage is large enough for electrons injected into the floating gate of the memory cells to be removed via the select gates; and (b) performing a switchover action such that a third voltage instead of the second voltage is applied to the even-numbered select gates, and that the electrons injected into the floating gate of the memory cell are pulled away via the select gates to turn the memory cells in an erased state.

8. The erasing method of claim 7, wherein after performing the step (a), the method further comprises checking whether the memory cells of each memory cell row has any erasing failure, and if at least one of the memory cells in the memory cell row has an erasing failure, the switchover action in step (b) is performed so that the electrons injected into the floating gate of the memory cells are pulled away via the select gates to turn the memory cells into an erased state.

9. The erasing method of claim 7, wherein the first voltage is between about 10V to 11V.

10. The erasing method of claim 9, wherein the second voltage is 0V.

11. The erasing method of claim 9, wherein the third voltage is equal to the first voltage.

12. The erasing method of claim 9, wherein the third voltage is between about 10V to 11V.

13. The erasing method of claim 7, wherein after performing the step (a), the method further comprises checking whether the memory cells of each memory cell row has any erasing failure, and if at least one of the memory cells in the memory cell row has an erasing failure, the switchover action in step (b) is performed so that a third voltage instead of the first voltage is applied to the even-numbered select gates of the memory cell row and the electrons injected into the floating gate of the memory cells are pulled away via the select gates to turn the memory cells into an erased state.

14. The erasing method of claim 13, wherein the first voltage is 0V.

15. The erasing method of claim 14, wherein the second voltage is between about 10V to 11V.

16. The erasing method of claim 14, wherein the third voltage is equal to the second voltage.

17. The erasing method of claim 14, wherein the third voltage is between about 10V to 11V.

* * * * *